United States Patent [19]

Choi et al.

[11] Patent Number: 4,774,205

[45] Date of Patent: Sep. 27, 1988

[54] MONOLITHIC INTEGRATION OF SILICON AND GALLIUM ARSENIDE DEVICES

[75] Inventors: Hong K. Choi, Concord; Bor-Yeu Tsaur, Bedford; George W. Turner, Chelmsford, all of Mass.

[73] Assignee: Massachusetts Institute of Technology, Cambridge, Mass.

[21] Appl. No.: 874,295

[22] Filed: Jun. 13, 1986

[51] Int. Cl.⁴ .................... H01L 7/36; H01L 21/20; H01L 21/324

[52] U.S. Cl. .............................. 437/59; 148/DIG. 26; 148/DIG. 72; 148/DIG. 97; 148/DIG. 149; 156/610; 156/612; 357/16; 357/41; 437/85; 437/90; 437/99; 437/107; 437/112; 437/129; 437/132; 437/946

[58] Field of Search ............ 29/576 E, 576 B, 569 L, 29/511, 578; 148/1.5, 175, 186, DIG. 100, 15, 26, 59, 99, 149, 110, 169; 156/610-614; 357/43, 41, 60, 16, 17; 437/51, 59, 126, 90, 99, 132, 54

[56] References Cited

U.S. PATENT DOCUMENTS

| | | | |
|---|---|---|---|
| 4,561,916 | 12/1985 | Akiyama et al. | 148/175 |
| 4,575,924 | 3/1986 | Reed et al. | 29/576 E |
| 4,587,717 | 5/1986 | Daniele et al. | 29/569 L |
| 4,632,712 | 12/1986 | Fan et al. | 148/175 |

FOREIGN PATENT DOCUMENTS

34048754A1 8/1985 Fed. Rep. of Germany.

OTHER PUBLICATIONS

Fischer et al., "Monolithic Integration of GaAs/AlGaAs . . . Silicon Circuits," Appl. Phys. Lett., 47(9), Nov. 1, 1985, pp. 983-985.

Choi et al., "Monolithic Integration of Si MOSFETs and GaAs MESFETs", IEDM, Nov. 30, 1985, pp. 766 and 767.

Morkoc et al., "High-Quality GaAs MESFETs Grown on Silicon Substrates by Molecular Beam Epitaxy", IEEE EDL, vol. 6, No. 7, Jul. 1985, pp. 381-383.

Choi et al., "GaAs MESFETs Fabricated on Monolithic GaAs/Si Substrates", IEEE, EDL, vol. 5, No. 6, Jun. 1984, pp. 207-208.

Windhorn et al., "AlGaAs Double-Heterostructure Diode Lasers . . . on a Monolithic GaAs/Si Substrate," Appl. Phys. Lett., 45(4), 1984, pp. 309-311.

Gale et al., "GaAs Shallow-Homojunction Solar Cells on Ge-Coated Si Substrates," IEEE EDL, vol. 2, No. 7, Jul. 1981, pp. 169-171.

Masselink et al., "Optical Properties of GaAs on (100) Si Using Molecular Beam Epitaxy", Appl. Phys. Lett., vol. 45, No. 6, pp. 1309-1311, 1984.

Ghandhi, "VLSI Fabrication Principles", John Wiley & Sons, New York, N.Y., 1983, pp. 422-430.

"Prospects for the Monolithic Integration of GaAs and Si", *Technical Digest on GaAs IC Symposium*, Monterey, Calif., Nov. 12-14, 1985, pp. 71-73, Fischer et al.

"Integrated Light-Emitting Devices with Silicon LSI Circuits", *IBM Technical Disclosure Bulletin*, vol. 22, No. 1, p. 401, New York, Jun. 1979, Hung et al.

"Monolithic Integration of Si MOSFET's and GaAs MESFET's, Choi et al., *IEEE Electron Device Letters*, vol. EDL-7, No. 4, Apr. 1986.

"Monolithic Integration of GaAs Light-Emitting Diodes and Si Metal-Oxide-Semiconductor Field-Effect Transistors", Ghosh et al., *Appl. Phys. Lett.*, 48(5), Feb. 1986.

*Primary Examiner*—Brian E. Hearn
*Assistant Examiner*—William Bunch
*Attorney, Agent, or Firm*—Hamilton, Brook, Smith & Reynolds

[57] ABSTRACT

Monolithic integration of Si MOSFETs and gallium arsenide MESFETs on a silicon substrate is described herein. Except for contact openings and final metallization, the Si MOSFETs are first fabricated on selected areas of a silicon wafer. CVD or sputtering is employed to cover the wafer with successive layers of SiO₂ and Si₃N₄ to protect the MOSFET structure during gallium arsenide epitaxy and subsequent MESFET processing. Gallium arsenide layers are then grown by MBE or MOCVD or VPE over the entire wafer. The gallium arsenide grown on the bare silicon is single crystal material while that on the nitride is polycrystalline. The polycrystalline gallium arsenide is etched away and MESFETs are fabricated in the single crystal regions by conventional processes. Next, the contact openings for the Si MOSFETs are etched through the Si₃N₄/SiO₂ layers and final metallization is performed to complete the MOSFET fabrication. In an alternative embodiment, Si MOSFETs and aluminum gallium arsenide double heterostructure LEDs are formed in a similar manner.

29 Claims, 5 Drawing Sheets

MONOLITHIC INTEGRATION OF SILICON AND GALLIUM ARSENIDE DEVICES

GOVERNMENT SPONSORSHIP

This invention was made in the course of work supported by the Department of the Air Force, Contract No. F19628-85-C-0002.

BACKGROUND ART

Monolithic integration of compound semiconductor (Group III-V or II-VI) devices and silicon devices on a common substrate has the potential for achieving very substantial improvements in the performance of Very Large Scale Integrated (VLSI) circuits. In particular, Monolithic integration of a GaAs compound semiconductor device and Silicon devices on a common substrate (MGS) enhances the VLSI circuit by combining the performance of silicon circuits with gallium arsenide and/or aluminum gallium arsenide optoelectronic components and high speed gallium arsenide and/or aluminum gallium arsenide circuits.

For example, the through-put of a silicon VLSI system may be considerably increased by integrating high-speed gallium arsenide input and/or output circuits, signal processing units and/or cache memory devices. As another example, gallium arsenide/ aluminum gallium arsenide optoelectronic interface units may provide high-data-rate optical links to replace wire interconnects between silicon VLSI subsystems.

While there exists a 4% lattice mismatch between gallium arsenide and silicon; device-quality gallium arsenide layers have been grown on silicon substrates by both molecular beam epitaxy (MBE) and metal organic chemical vapor deposition. For true MGS integration, however, it is necessary to fabricate both gallium arsenide and silicon devices on the same wafer or substrate.

DISCLOSURE OF THE INVENTION

The present invention relates, in general, to a method for fabricating compound semiconductor devices of III-V or II-VI material and semiconductor devices of silicon on a common substrate. The III-V material is preferably gallium arsenide or alloys of gallium arsenides, such as aluminum gallium arsenide. The II-VI material may comprise cadmium telluride. For ease in description, it should be understood that references hereafter to gallium arsenide are intended to also encompass aluminum gallium arsenide or other gallium arsenide metal alloys, as well as gallium arsenide itself, unless otherwise indicated.

The method of the invention comprises, in general, the following steps. First, a layer, preferably of thermal oxide, is formed on a Si substrate, preferably a single crystal silicon wafer. Alternatively, a LOCOS (Local Oxide of Silicon) process can be used to grow oxide in selected areas of the silicon wafer. Silicon devices, such as a Metal Oxide Semiconductor Field Effect Transistor (MOSFET) are then fabricated on the Si substrate in openings made in the thermal oxide layer or in regions not covered by the LOCOS oxide. Conventional processes are then used for the fabrication of the gate, source, and drain regions of the MOSFETs.

Next, a protective or capping layer is formed over the entire device regions and the rest of the wafer. This particular layer may be formed, for example, by chemical vapor deposition, preferably by a first oxide layer of $SiO_2$ followed by a second nitride layer of $Si_3N_4$.

It should be noted that while the silicon MOSFETs are fabricated first, the contact openings and final metallization of the MOSFETs are left until after the III-V or II-VI compound devices are fabricated as described below.

Openings are formed through the protective layer laterally displaced from the regions where the MOSFETs are fabricated. These openings extend to the silicon substrate and result in exposed surfaces thereon; upon which the III-V or II-VI compound device may be fabricated. Compound semiconductor layers are then grown, as by molecular beam epitaxy or vapor-phase epitaxy over the entire wafer.

The compound layer grown on the bare silicon surface is single crystal material, while that grown on the protective layer surface is polycrystalline in form. The poly-layer regions are etched away and compound devices, such as Metal Semiconductor Field Effect Transistors (MESFETs) and/or Light-Emitting Diodes (LEDs) are fabricated on the single crystal regions by conventional processes.

After the compound semiconductor devices are fabricated, contact openings for the silicon MOSFETs are etched through the protective layers and ohmic-contact metallization is formed on the gate source, and drain regions to complete the Si MOSFET fabrication. As one may choose, the Si MOSFETs and compound semiconductor devices can be interconnected together during the metallization of Si devices or by using additional metallization steps.

In an alternate embodiment, interconnections are provided in the Si substrate by suitably doping the region beneath the exposed Si surface and extending that surface so that contact is established between the doped Si region and the region of the Si device to which connection is required. The initial layer of III-V or II-VI material deposited on the heavily doped Si region is also heavily doped of the same polarity and the interface between the two forms a low resistance connection.

The foregoing and other features and advantages of the invention will now be described in connection with the drawings. It should be noted that in the embodiments shown herein, GaAs or AlGaAs has been chosen to illustrate the process, but as mentioned above, other III-V compounds or alloys, such as InP, etc., may be substituted therefore or II-VI compounds, such as CdTe may be employed in place of the III-V compounds.

BRIEF DESCRIPTION OF THE DRAWINGS

FIG. 1A shows the silicon MOSFETs fabricated in selected areas of the silicon substrate and the device is covered with a protective layer of $SiO_2/Si_3N_4$.

FIG. 1B shows the gallium arsenide epitaxy processing step.

FIG. 1C shows the gallium arsenide MESFET processing, and

FIG. 1D shows the silicon contact formation and metallization process steps.

BEST MODE OF CARRYING OUT THE INVENTION

I. INTEGRATION OF Si MOSFETs and GaAs MESFETs

Figure 1A:
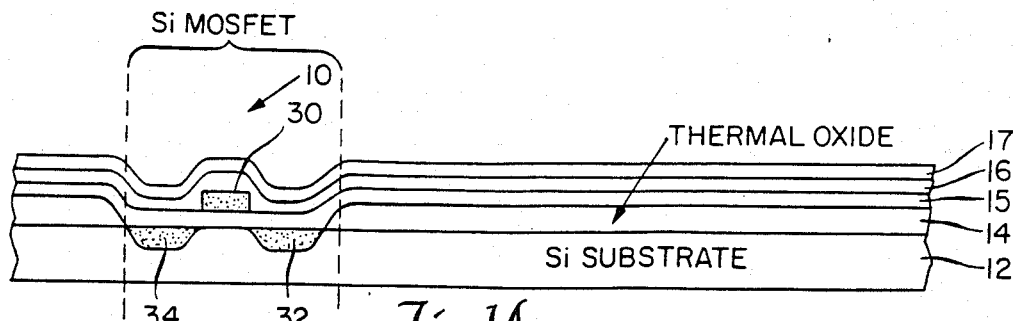
FIGS. 1A–D are schematic cross-sectional drawings of the silicon processing for an MGS embodiment of the invention wherein a silicon MOSFET is fabricated along with a gallium arsenide MESFET on a single silicon substrate.

The sequence of processing steps for fabricating MGS Si MOSFETs and GaAs MESFETs on an Si substrate, in accordance with the invention, is shown in FIGS. 1A–D. Referring to FIG. 1A, the Si MOSFETs 10 are fabicated first, except for contact openings and final metallization, on selected areas of a 1–3 ohms-cm p-type Si single crystal wafer or substrate 12 oriented 3° off the (100) crystalographic plane toward the (111) plane. A standard poly-Si gate process is used for MOSFET fabrication. This poly-Si process consists, in general, of forming a thermal oxide $SiO_2$ layer 14 over the wafer 12; forming openings through layer 14; forming a thin gate oxide layer 15; depositing a poly-Si layer (not shown) over the entire wafer; etching the poly-Si layer outside the gate area 30; performing ion implantation using poly-Si gate 30 and $SiO_2$ 14/15 as a mask for ion implantation of drain and source n+ regions 34 and 32, respectively. The gate region 30 is also doped by ion implantation at the same time to form an n+ gate.

Chemical vapor deposition is then employed to cover the entire wafer with successive layers of $SiO_2$ 16 and $Si_3N_4$ 17 to protect the MOSFET structures during subsequent GaAs epitaxy and subsequent MESFET processing. The $Si_3N_4$ layer is used because $SiO_2$ is a poor diffusion barrier for Ga. However, for thin film, low temperature GaAs layers, a single layer of $SiO_2$ may be adequate.

Figure 1B:
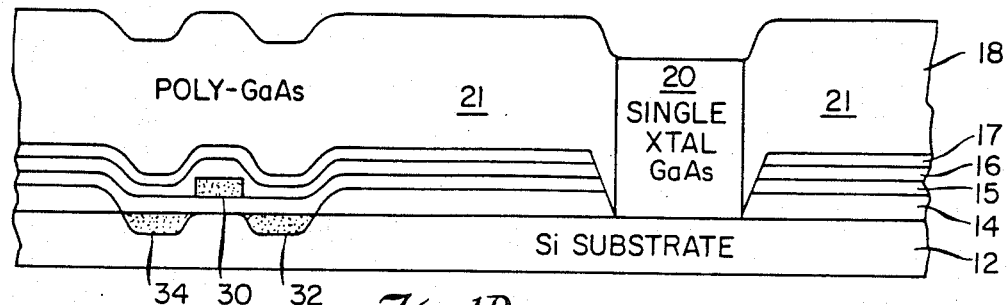

Referring to FIG. 1B, 300 micron square openings are etched in the $Si_3N_4/SiO_2$ cap layers 17/16 and oxide layers 14/15 to expose the bare Si substrate surface in the regions where GaAs devices are to be fabricated. GaAs layers 18 are then grown over the entire wafer, such as by MBE.

Preferbly, before being loaded into the MBE system, the wafer, as thus far processed, is throughly cleaned and any surface oxide present is etched from the bare Si regions by dipping in HF. The wafer is heated in situ to about 850° C. for a short period to desorb any remaining surface oxide. GaAs growth is initiated at a relatively low temperature to promote GaAs nucleation, and the temperature is then raised to about 580° C. for the remaining growth. The GaAs 20 grown on the bare surface Si 12 is single-crystal material, while that on the nitride 17 is polycrystalline 21.

Transmission electron microscopy shows that the single-crystal GaAs near the GaAs/Si interface has a dislocation density exceeding $10^{10}$ cm$^{-2}$ due to the lattice mismatch. As growth continues, however, only a small fraction of the dislocations propagate toward the surface. Material with a dislocation density of $10^6$–$10^7$ cm$^{-2}$ is obtained when the thickness exceeds about 2 microns.

Figure 1C:
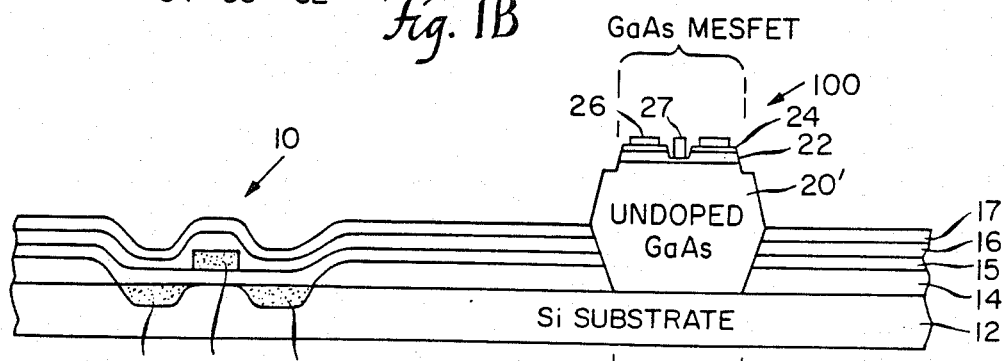
Figure 1D:
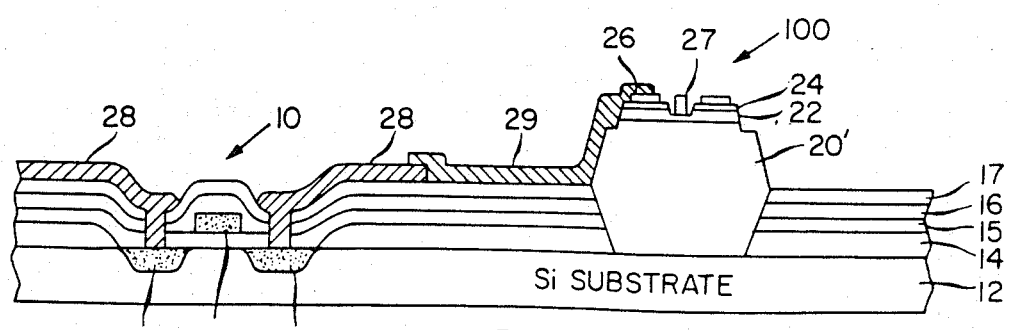

Referring to FIG. 1C, the GaAs layers grown for the MESFET structure 100 are a 4-micron-thick nominally undoped buffer layer 20', an n active layer 22 doped with Si to $3 \times 10^{17}$ cm$^{-3}$, and an n+ contact layer 24 doped to more than $2 \times 10^{18}$ cm$^{-3}$.

The polycrystalline GaAs 21 is then etched away (as shown in FIG. 1C),and MESFETs are fabricated in the single-crystal regions by the conventional recessed gate process. The gate metal 27 is Al, and Ge/Au/Ni is used for ohmic contacts 26. Next, (See FIG. 1D) contact openings for the Si MOSFETs 10 are etched in the $Si_3N_4/SiO_2$ layers 17/16 and oxide layer 15, and metallization 28 to provide ohmic contacts is performed by evaporating Al to complete fabrication of MOSFET 10. Metal interconnections 29 may be similarly formed between the MESFET and MOSFET contacts.

Figure 2:
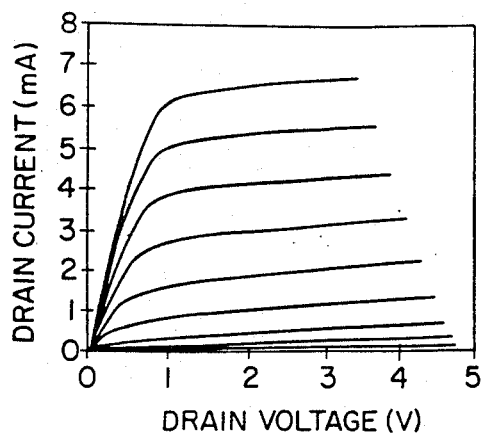
FIG. 2 is a plot of the transistor characteristics (current in milliamps v. voltage with 200 millivolt gate voltage steps between curves) of a gallium arsenide MESFET made in accordance with the invention.
Figure 3:
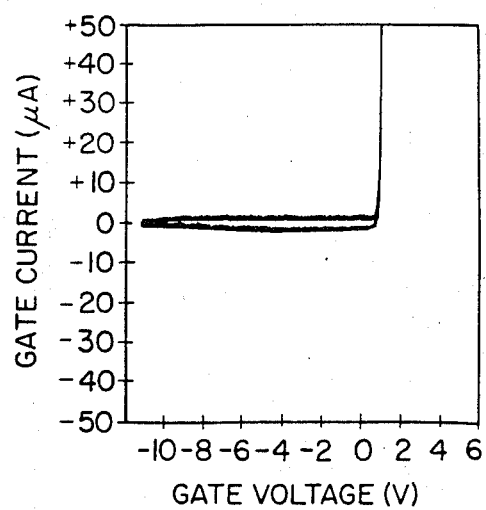
FIG. 3 is a plot of the gate Schottky diode characteristics of a gallium arsenide MESFET made in accordance with the invention.

An Si MOSFET with an adjacent GaAs MESFET has been fabricated, as above, in which the gate lengths of the Si and GaAs devices are 5 and 1 microns, respectively, and in which the gate width is 40 microns for both devices. The GaAs MESFETs have well behaved characteristics, as shown in the transistor I-V plot of FIG. 2, with transconductance of about 150 mS/mm. The measured source resistance is about 1 ohm-mm giving an intrinsic transconductance of about 175 mS/mm. The output conductance has a fairly low value of about 3.5 mS/mm. The gate Schottky diodes have a breakdown voltage of more than 10V and negligible leakage current, as shown in FIG. 3, and the breakdown is sharp. These results are comparable to those obtained for state-of-the-art GaAs MESFETs of similar gate length fabricated on single-crystal GaAs substrates.

Figure 4A:
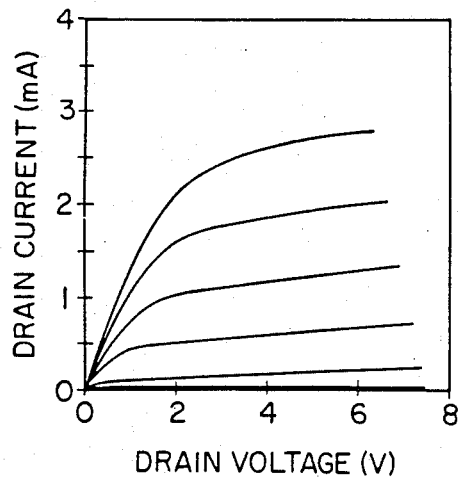
FIG. 4 is a plot of the silicon MOSFET characteristics (A) with and (B) without gallium arsenide MESFET processing steps.
Figure 4B:
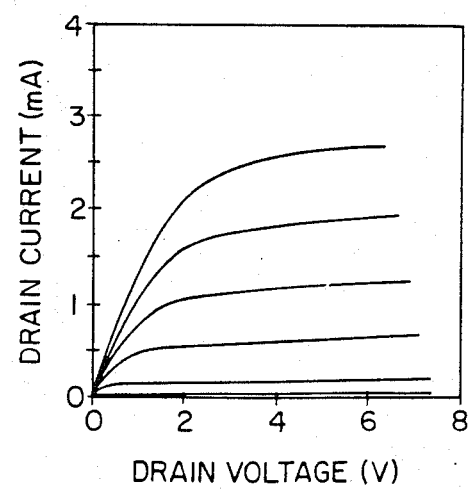

The MGS Si MOSFETs have normal transistor characteristics, as shown in FIG. 4A. The transconductance is about 19 mS/mm for a gate oxide thickness of 800 A. FIG. 4B shows the transistor characteristics of control devices fabricated on a separate Si wafer. The characteristics of the devices fabricated with and without GaAs processing steps are seen to be nearly identical.

II. INTEGRATION OF Si MOSFETs AND GaAs/AlGaAs DOUBLE-HETEROSTRUCTURE LEDs

Figure 5:
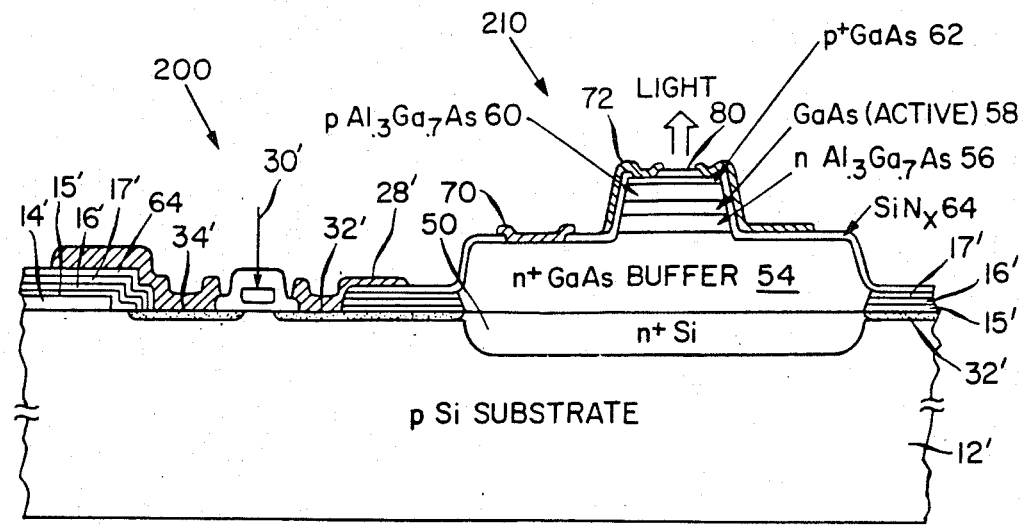
FIG. 5 is a schematic cross-sectional diagram of a monolithically integrated silicon MOSFET 200 and gallium arsenide/alminum gallium arsenide light emitting diode 210 made in accordance with the invention.

FIG. 5 is a partial schematic diagram of an alternate embodiment of the invention in cross-section. In this embodiment GaAs/AlGaAs double-heterostructure, LEDs 210 are formed on a Si substrate 12' surrounded by a ring-type MOSFET 200. The right side of the ring is not shown in FIG. 5 for simplicity. The sequence of processing steps is as follows. After initial thermal oxidation 14' of a p-type Si wafer 12', openings of 200 microns×400 microns are etched in the SiO$_2$ 14', and a high dose of arsenic ions is implanted to form n+ islands 50 by converting the surface of the exposed Si wafer 12'. A Si MOSFET 200 is fabricated around each n+ island, except for contact openings and final metallization. The MOSFET drain region 32' is in contact with the edge of n+ island 50. The entire wafer is capped with successive layers of SiO$_2$ 16' and Si$_3$N$_4$ 17', and openings are etched to expose the n+ Si islands 50. Molecular beam epitaxy is employed to deposit the following series of layers for the LEDs: 3-microns-thick n+ GaAs buffer 54, a 0.5-microns-thick n Al$_{0.3}$Ga$_{0.7}$As 56, a 0.4-microns-thick p GaAs active 58, 0.5-microns-thick Al$_{0.3}$Ga$_{0.7}$As 60, and 0.25-microns-thick p+ GaAs cap 62. The growth conditions are similar to those described in the previous embodiment above, except that the AlGaAs growth temperature is about 700° C.

The heavily doped n+ Si island 50 forms an internal low resistance interconnect between the drain 32' of the Si MOSFET 200 and the n+ GaAs cathode 54 of LED 210.

The polycrystalline GaAs/AlGaAs layers deposited as above on the Si$_3$N$_4$/SiO$_2$ cap are removed by etching. Octagonal mesas for LEDs are formed in the monocrystalline GaAs/AlGaAs islands grown on bare Si by etching down to the n+ GaAs buffer. Plasma-enhanced chemical vapor deposition is used to deposit SiN$_x$ 64 over the entire wafer. Contact openings are etched in the nitride layer 64 for LEDs and in the nitride/oxide layer 64/17'/16' 15'/14' for MOSFETs. Metallization is performed by evaporating Al 28' on the MOSFETs and Ni/Ge/Au 70 and Cr/Au 72, respectively, on the cathode 54 and anode 62 of the LEDs 210.

Contact 28' to the MOSFET drain 32' and contact 70 to the LED cathode 54, although not utilized in joint operation of the two devices, are made in order to permit the characteristics of each device to be measured separately. To accommodate these additional contacts, it is necessary to increase the area of the n+ Si layer, thereby substantially increasing the drain/cathode capacitance.

Figure 6:
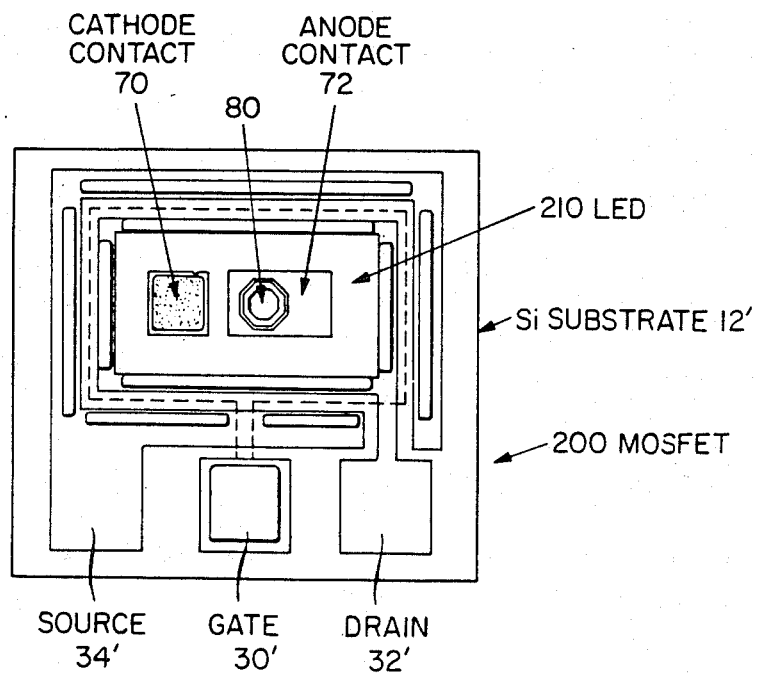
FIG. 6 is a drawing of a planar top view of the gallium arsenide/aluminum gallium arsenide LED 210 and the surrounding silicon MOSFET 200 of FIG. 5.
Figure 7A:
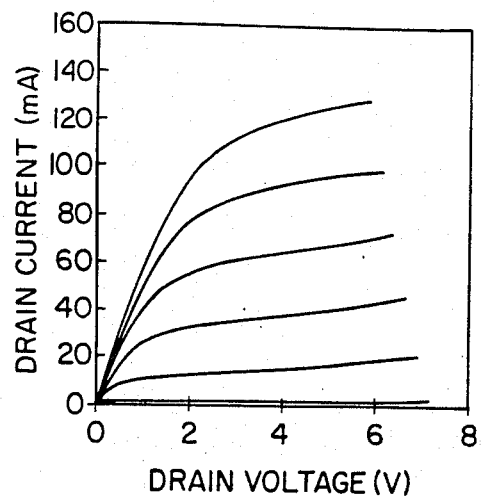
FIG. 7 is a plot of the silicon MOSFET characteristics of FIGS. 5 and 6 (A) with and (B) without gallium arsenide/aluminum gallium arsenide LED processing steps.
Figure 7B:
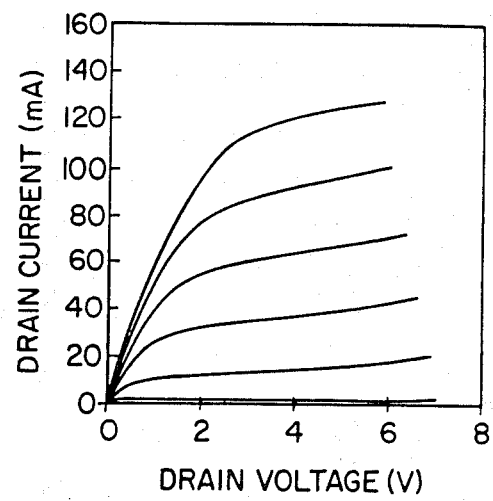

FIG. 6 is a top planar view showing a completed GaAs/AlGaAs LED 210 surrounded by a Si MOSFET 200 made as described above. The LED mesa has a diameter of 75 microns, and the unmetallized opening 80 for LED emission has a diameter of 50 microns. The MOSFET has a gate length of 5 microns and gate width of 1.6 mm. The MGS MOSFETs 200 have normal transistor characteristics. FIG. 7A shows the characteristics of a typical device, which delivers about 120 mA with both gate and drain set at 5V. FIG. 7B shows the characteristics of a control MOSFET fabricated on a separate Si wafer. The characteristics of the devices fabricated with and without GaAs/AlGaAs growth and processing steps are see to be almost the same.

Figure 8:
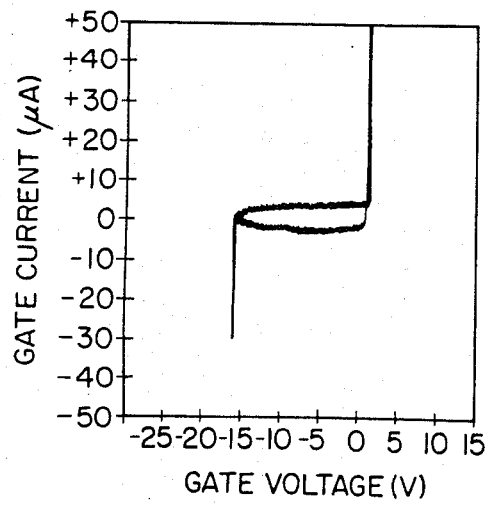
FIG. 8 is a plot of the current vs. voltage characteristics of the MGS LED of FIGS. 5 and 6.

The MGS LED 210 has a breakdown voltage of about 16V with negligible leakage current, as shown in FIG. 8. This is the same as the value obtained for control devices fabricated on a GaAs substrate.

At low forward bias voltages, both the MGS and control LEDs have an ideality factor close to 2, indicating that recombination is the dominant mechanism of current flow. However, at a given bias voltage, the current is about 50 times higher for the MGS devices than for the control devices. This implies that the minority carrier lifetime is much shorter for the MGS GaAs/AlGaAs layers than for the control layers.

Figure 9:
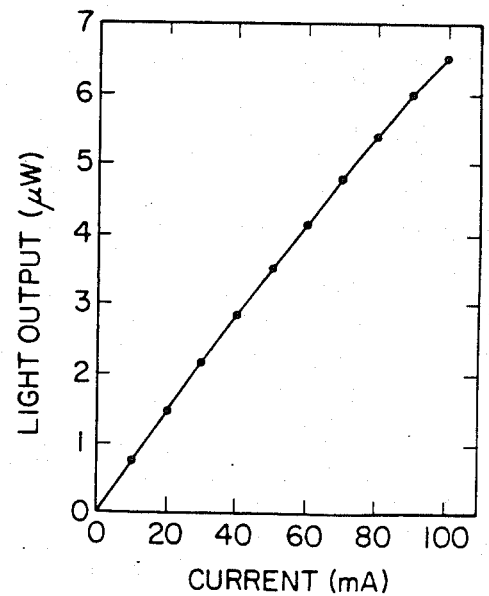
FIG. 9 is a plot of a light output vs. current characteristics of the MGS LED of FIG. 5.

FIG. 9 shows the light output vs DC current characteristic for MGS LED 210. A microscope lens with numerical aperture of 0.65 was used to focus the light on a 1-cm-diameter p-i-n photodiode detector. The characteristic is slightly sublinear because of heating. At 100 mA DC current, the output is about 6.5 uW, which is 10-15% of the output from control devices.

The MGS LEDs have a non-uniform near-field pattern with many dark spots, while the pattern for the control LEDs is uniform. The peak of the MGS LED spectrum is at 875 nm, about 5 nm greater than that for the control devices. The shift can be attributed to tensile stress in the MGS GaAs/AlGaAs layers.

To characterize the heterojunction between the n+ Si and n+ GaAs layers, an I-V curve was measured for current flow between the MOSFET drain and LED cathode contacts 28' and 70. The characteristic was ohmic, showing that there is no barrier to the heterojunction. The measured resistance was 3 ohms. This value represents an upper limit on the heterojunction resistance, since it includes the resistance of the drain and cathode contacts.

With the MGS LED anode 62 biased at 5V, the light output was modulated by applying a stream of voltage pulses to the MOSFET gate 30'. The light was focused with the microscope lens on a 0.5-mm-diameter avalanche photodiode detector.

Figure 10A:
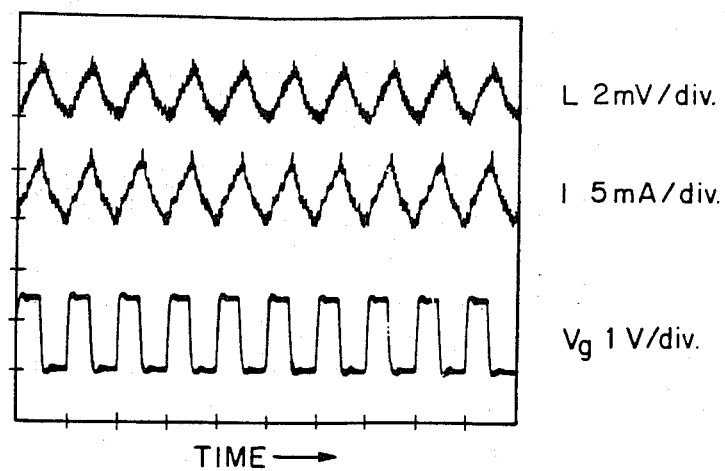
FIG. 10 is a plot of the modulation characteristics of an MGS LED at (A) 20 megahertz and (B) 27 megabits per second. The bottom, middle and top traces are the time wave forms of the gate voltage $V_g$, drain or LED current I, and light output L, respectively.
Figure 10B:
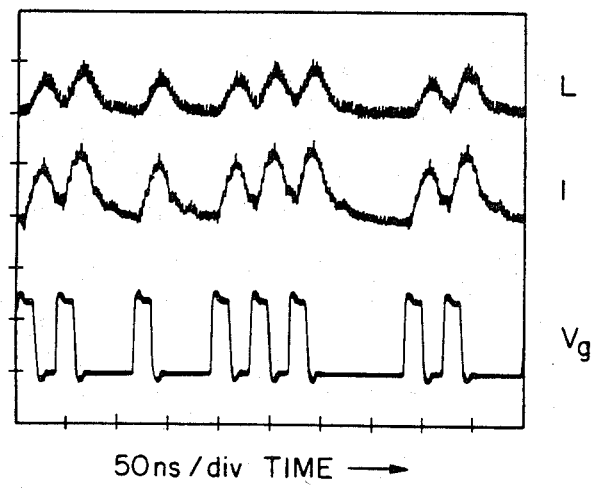

FIG. 10A shows the gate voltage, LED current, and light output waveforms obtained when the voltage pulses were applied at a repetition rate of 20 MHz. The current waveform is distorted with respect to the voltage waveform in a manner characteristic of charging and discharging a capacitance, but the light output closely follows the current. These observations show that the output modulation is limited not by the speed of the LED but by the rate at which the MOSFET charges and discharges the drain/cathode capacitance, which is estimated to be about 200 pF. This conclusion is confirmed by the fact that modulation rates exceeding 100 MHz were obtained when the LED was driven directly with a pulse generator. FIG. 10B shows the waveforms obtained when a bit pattern was applied to the gate at a modulation rate of 27 Mbps. Although there is some pattern effect, each bit is clearly resolved.

III. SUMMARY

The monolithic integration of Si MOSFETs with GaAs MESFETs and also with GaAs/AlGaAs double-heterostructure LEDS, has been described. The operating characteristics of the MGS MOSFETs and MESFETs are comparable to those of similar devices fabricated on separate Si and GaAs substrates. LED modulation rates up to 27 Mbps have been accomplished by applying a stream of voltage pulses to the MOSFET gate. It should be possible to achieve much higher modulation rates by scaling down the device dimensions to reduce parasitic capacitance.

EQUIVALENTS

While the above described embodiments of the invention are preferred, other configurations will be readily apparent to those skilled in the art and thus the invention is only to be limited in scope by the language of the following claims and equivalents. For example, the term Si substrate or wafer is intended to include an SOS (Silicon on Sapphire) substrate, or a Silicon on Insulator (Si on SiO$_2$ on Si) substrate. In addition to LEDs, other optoelectronic devices may be fabricated on the exposed Si surface, such as lasers or light detectors. Other type transistors, such as bipolar or modulation doped FETs (MODFETs) may be substituted for the MESFETs or the Si MOSFETs.

What is claimed is:

1. A method of fabricating compound semiconductor devices of III-V or II-VI material and semiconductor devices of silicon on a common substrate comprising the steps of:
   (a) forming Si devices on selected areas of said substrate;
   (b) forming a protective layer over the Si devices and portions of the remainder of said substrate laterally displaced from the Si devices;
   (c) forming openings laterally displaced from the Si devices through said protective layer to expose regions of the surface of said substrate;
   (d) forming a layer of said compound semiconductor over at least the exposed surface regions, which layer is single crystalline above the exposed surface regions and polycrystalline to the extent deposited elsewhere;
   (e) removing the compound semiconductor polycrystalline layer to the extent deposited elsewhere;
   (f) forming said compound semiconductor devices on the remaining single crystalline compound semiconductor; and
   (g) then forming ohmic contacts on said devices.

2. The method of claim 1 including forming interconnects for the Si devices and compound semiconductor devices and between the Si and compound semiconductor devices.

3. The method of claim 1 wherein the substrate comprises a single crystal: silicon, or a silicon on sapphire, or a silicon-on-insulator substrate.

4. The method of claim 1 wherein the protective layer comprises a layer of SiO$_2$.

5. The method of claim 1 wherein the protective layer comprises layers of SiO$_2$ and Si$_3$N$_4$.

6. The method of claim 1 wherein the compound semiconductor is GaAs or an alloy thereof.

7. The method of claim 6 wherein the gallium arsenide semiconductor device is an optoelectronic device 8. The method of claim 1 wherein the Si devices are part of an Si circuit.

9. The method of claim 1 wherein the compound semiconductor devices are transistors from the class comprising MESFETs, bipolar transistors, or modulation doped FETs.

10. The method of claim 1 wherein the compound semiconductor devices are optoelectronic devices from the class comprising LED, lasers and light detectors.

11. The method of claim 1 wherein the compound semiconductor devices are part of a circuit consisting of transistors and optoelectronic devices.

12. A method of fabricating semiconductor devices of gallium arsenide and semiconductor devices of silicon on a common Si, SOS, or SOI substrate surface comprising the steps of:
   (a) forming a heavily doped connection region in said substrate;
   (b) forming silicon devices on selected regions of said surface adjacent said connection region with a portion of said silicon devices contacting said connection region;
   (c) forming a protective layer over said devices and adjacent regions of said substrate;
   (d) forming openings through said protective layer to expose additional regions of the surface of said substrate, said openings exposing at least a portion of said connection region;
   (e) forming a gallium arsenide buffer layer over the exposed surface regions;
   (f) forming a gallium arsenide semiconductor device over the buffer layer; and
   (g) forming ohmic contacts on said devices.

13. The method of claim 12 wherein low resistance interconnection between the Si devices and the gallium arsenide devices is made by heavily doping the buffer layer with the same type conductivity as the connection region during the formation of the gallium arsenide buffer layer.

14. The method of claim 12 wherein the protective layer comprises a layer of SiO$_2$.

15. The method of claim 12 wherein the protective layer comprises layers of SiO$_2$ and Si$_3$N$_4$.

16. The method of claim 1 wherein prior to step (b) heavily doped n+ islands are formed adjacent and in contact with doped regions of said Si devices to form low resistance interconnection paths to said compound semiconductor device.

17. The method of claim 1 wherein the silicon devices are formed on selected areas of a silicon single crystal wafer which is oriented at an angle off the crystallographic plane.

18. The method of claim 1 wherein the ohmic contacts for said Si devices and compound semiconductor devices is formed after the compound semiconductor device is formed and the ohmic contacts for the Si devices is formed through openings made in said protective layer.

19. The method of claim 12 wherein the ohmic contacts for said silicon devices is made after said gallium arsenide semiconductor device is formed.

20. The method of claim 12 wherein the ohmic contacts for said silicon devices is made through openings formed in said protective layer.

21. A method of fabricating compound semiconductor devices of III-V or II-VI material and semiconductor devices of silicon on a common substrate with low resistance interconnections between the compound semiconductor devices and the silicon devices comprising the steps of:
   (a) forming Si devices on selected areas of a planar surface of said substrate having junctions formed of opposite conductivity regions and wherein one of said regions extends laterally along the planar surface of the substrate;
   (b) forming a protective layer over the Si devices and portions of said substrate surface;
   (c) forming openings laterally displaced from the Si devices through said protective layer to expose regions of the surface of said substrate including at least a portion of said extended region;
   (d) forming a buffer layer of said compound semiconductor of the same type conductivity as the extended region over the protective layer and the exposed surface regions, which layer is single crystalline above the exposed surface regions and polycrystalline elsewhere;
   (e) removing the compound semiconductor polycrystalline layer to the extent deposited elsewhere;

(f) forming said compound semiconductor devices on the remaining single crystalline compound semiconductor with said extended region of said Si devices forming said low resistance interconnection to said buffer layer; and (g) forming ohmic contacts on said devices.

22. A method of fabricating compound semiconductor devices of III-V or II-VI material and semiconductor devices of silicon on a common substrate comprising the steps of:

(a) forming Si devices on selected areas of said substrate wherein said substrate comprises a single crystal wafer oriented at an angle of about 3° off the (100) crystallographic plane toward the (111) plane;

(b) forming a protective layer over the Si devices and the remainder of said substrate;

(c) forming openings laterally displaced from the Si devices through said protective layer to expose regions of the surface of said substrate;

(d) forming a layer of said compound semiconductor over the protective layer and the exposed surface regions, which layer is single crystalline above the exposed surface regions and polycrystalline elsewhere;

(e) removing the compound semiconductor polycrystalline layer;

(f) forming said compound semiconductor devices on the remaining single crystalline compound semiconductor; and (g) forming ohmic contacts on said devices.

23. The method of claim 1 wherein the layer formed in step (d) is formed by molecular beam epitaxy.

24. The method of claim 23 wherein prior to the molecular beam epitaxy step the layer in step (d) is comprised of GaAs or an alloy thereof and the exposed surface regions are etched to remove any surface contaminants and the structure thus far formed is subjected to a heat treatment sufficient to desorb any oxide found in such surface regions.

25. The method of claim 24 wherein the molecular beam epitaxy process commences at a relatively low temperature to promote GaAs nucleation and is then raised to about 580° C. for a GaAs Layer or about 700° C. for an allow of GaAs layer.

26. A method of fabricating compound semiconductor devices of III-V or II-VI material and semiconductor devices of silicon on a common substrate comprising the steps of:

(a) forming Si devices on selected areas of said substrate;

(b) forming a protective layer over the Si devices and portions of the remainder of said subsrate laterally displaced therefrom;

(c) forming openings laterally displaced from the Si devices through said protective layer to expose regions of the surface of said substrate;

(d) forming a layer of said compound semiconductor over the protective layer and the exposed surface regions, which layer is single crystalline above the exposed surface regions and polycrystalline elsewhere;

(e) removing the compound semiconductor polycrystalline layer;

(f) forming said compound semiconductor devices on the remaining single crystalline compound semiconductor; and (g) then forming ohmic contacts on said devices.

27. The method of claim 24 wherein the heat treatment is conducted at a temperature of about 850° C.

28. The method of claim 21 wherein the buffer layer and extended region is heavily doped and of the same type conductivity.

29. The method of claim 28 wherein the dopant for the buffer layer and extended region is n+.

* * * * *

UNITED STATES PATENT AND TRADEMARK OFFICE
CERTIFICATE OF CORRECTION

PATENT NO. : 4,774,205
DATED : Sep. 27, 1988
INVENTOR(S) : Hong K. Choi, Bor-Yeu Tsaur, George W. Turner It is certified that error appears in the above—identified patent and that said Letters Patent is hereby corrected as shown below:

Claim 25, column 10, line 7, "allow" should be ---alloy---.

Claim 26, column 10, line 15, "subsrate" should be ---substrate---.

Signed and Sealed this

Sixth Day of June, 1989

Attest:

DONALD J. QUIGG

Attesting Officer

Commissioner of Patents and Trademarks